United States Patent
Kondo et al.

[11] Patent Number: 5,176,852
[45] Date of Patent: Jan. 5, 1993

[54] ADHESIVE COMPOSITIONS

[75] Inventors: Tomonobu Kondo, Nagareyama; Masao Okamura, Yokohama, both of Japan

[73] Assignee: Nippon Unicar Company Limited, Danbury, Conn.

[21] Appl. No.: 353,598

[22] Filed: May 18, 1989

[51] Int. Cl.$^5$ .............. H01B 1/24; C08K 3/04
[52] U.S. Cl. ................... 252/510; 252/510; 428/244; 524/543; 524/495; 524/496
[58] Field of Search .............. 252/511, 510; 524/495, 524/496, 543, 544; 428/244

[56] References Cited

U.S. PATENT DOCUMENTS

| | | | |
|---|---|---|---|
| 4,465,615 | 8/1984 | Hata et al. | 252/511 |
| 4,578,286 | 3/1986 | Vasta | 252/511 |
| 4,592,861 | 6/1986 | Bekele et al. | 252/511 |
| 4,678,602 | 7/1987 | Tanaka et al. | 252/511 |
| 4,704,231 | 11/1987 | Chung | 252/511 |

FOREIGN PATENT DOCUMENTS 61-288901 12/1986 Japan.

Primary Examiner—Mark L. Bell
Assistant Examiner—C. Melissa Bonner
Attorney, Agent, or Firm—Saul R. Bresch

[57] ABSTRACT

An adhesive composition comprising:
(a) about 30 to about 95 parts by weight of a grafted linear low density polyethylene;
(b) about 5 to about 70 parts by weight of a grafted (i) copolymer of ethylene and an unsaturated ester or (ii) a non-polar polyethylene having a crystallinity of no greater than about 38 percent by weight based on the weight of the non-polar polyethylene and a density of no greater than about 0.915 gram per cubic centimeter,
wherein components (a) and (b) have been grafted with an unsaturated organic compound selected from the group consisting of acids, acid anhydrides, acyl halides, amides, imides, and epoxy esters, and parts by weight are based on 100 parts by weight of components (a) and (b) combined; and
(c) about 5 to about 50 percent by weight of an electrically conductive material in the form of particles or fibers, the percent by weight being based on the total weight of components (a) and (b).

16 Claims, 1 Drawing Sheet

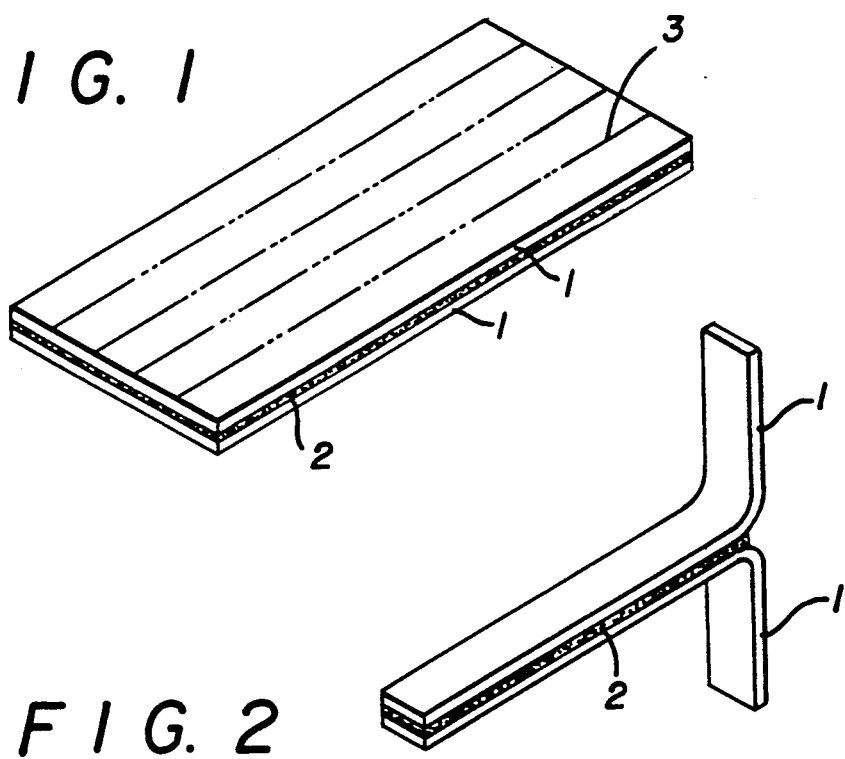
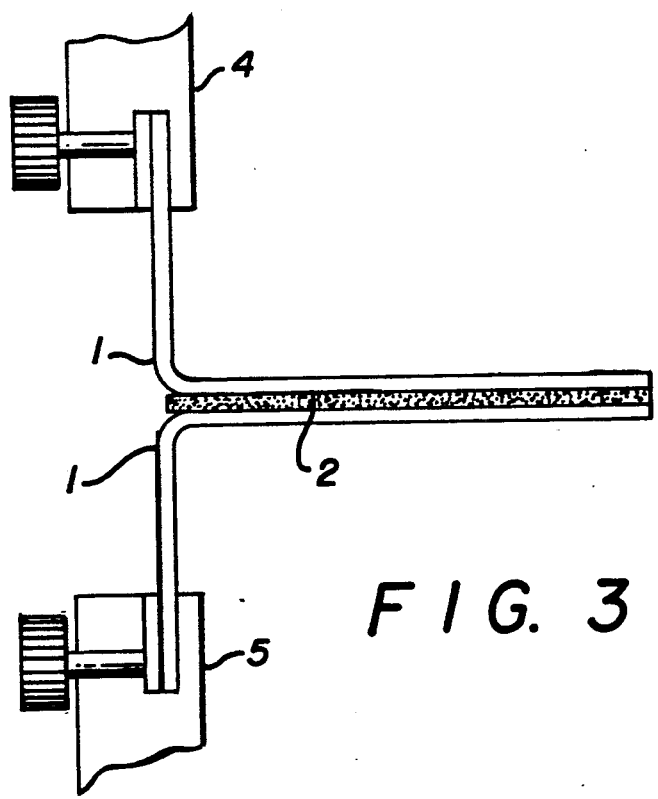

ADHESIVE COMPOSITIONS

TECHNICAL FIELD

This invention relates to adhesive compositions which are useful in electrical applications.

BACKGROUND ART

It is known to prepare electrically conductive adhesive compositions by, for example grafting low density polyethylene with maleic anhydride and kneading the grafted resin with carbon black. However, low density polyethylene does not provide sufficient adhesiveness and heat resistance. High density polyethylene, on the other hand, cannot be filled sufficiently to obtain the desired conductivity without detracting from its moldability. Large quantities of electrically conductive filler also have a negative effect on low temperature adhesiveness.

DISCLOSURE OF THE INVENTION

An object of the invention, therefor, is to provide a resin composition with the requisite heat resistance, adhesiveness, conductivity, and moldability for high and low temperature electrical applications.

Other objects and advantages will become apparent hereinafter.

According to the present invention, the above object is met by an adhesive composition comprising:

(a) about 30 to about 95 parts by weight of a grafted linear low density polyethylene; and (b) about 5 to about 70 parts by weight of a grafted (i) copolymer of ethylene and an unsaturated ester or (ii) a non-polar polyethylene having a crystallinity of no greater than about 38 percent by weight based on the weight of the non-polar polyethylene and a density of no greater than about 0.915 gram per cubic centimeter, wherein components (a) and (b) have been grafted with an unsaturated organic compound selected from the group consisting of acids, acid anhydrides, acyl halides, amides, imides, and epoxy esters, and parts by weight are based on 100 parts by weight of components (a) and (b) combined; and (c) about 5 to about 50 percent by weight of an electrically conductive material in the form of particles or fibers, the percent by weight being based on the combined weight of components (a) and (b).

BRIEF DESCRIPTION OF THE DRAWING

FIG. 1 is a three-dimensional view of a laminate prior to division for use in the examples.

FIG. 2 is a three-dimensional view of a test specimen.

FIG. 3 is a schematic diagram of a side view of the gripping means of a testing apparatus ether with a test specimen.

DETAILED DESCRIPTION

The linear low density polyethylene is preferably prepared by conventional vapor phase processes; has a melt index in the range of about 0.5 to about 50 grams per 10 minutes (determined under ASTM D-1238, Condition E, and measured at 90° C.); and, insofar as molecular weight distribution is concerned, a ratio of weight average molecular weight to number average molecular weight of about 2.5 to about 4.

A process for preparing the linear low density polyethylene is described in U.S. Pat. No. 4,508,842. The process involves the copolymerization of ethylene and an alpha-olefin, preferably one containing 3 to 8 carbon atoms, e.g., propylene, 1 butene, 1-pentene, 1-hexene, and 4-methyl-1-pentene. The density is adjusted by changing the content of the alpha-olefin comonomer generally within the range of about 5 to about 15 percent by weight based on the weight of the copolymer. Typically, the density is in the range of about 0.915 to about 0.940 gram per cubic centimeter.

The linear low density polyethylene is blended with (i) a copolymer of ethylene and an unsaturated ester or (ii) a non-polar polyethylene having a crystallinity of no greater than about 38 percent by weight based on the weight of the non-polar polyethylene and a density of no greater than about 0.915 gram per cubic centimeter.

The unsaturated ester comonomer can have 4 to 8 carbon atoms and preferably has 4 or 5 carbon atoms. Examples of the unsaturated ester are ethyl acrylate, vinyl acetate, methyl methacrylate and vinyl propionate. The preferred comonomers are ethyl acrylate and vinyl acetate. The comonomer content can be less that about 40 percent by weight based on the weight of the copolymer and is preferably in the range of about 5 to about 25 percent by weight. The melt index of the copolymer can be in the range of about 0.1 to about 200 grams per 10 minutes and is preferably in the range of about 0.5 to about 30 grams per 10 minutes. A process for the preparation of the copolymer of ethylene and the unsaturated ester is described in U.S. Pat. No. 3,334,081.

The non-polar polyethylene has a crystallinity of no greater than about 38 percent by weight based on the weight of the non-polar polyethylene and preferably has a crystallinity in the range of about 18 percent by weight to about 30 percent by weight. The density is preferably in the range of about 0.860 to about 0.915 gram per cubic centimeter. The non polar polyethylene can be prepared by the process described in U.S. Pat. No. 4,302,565.

The linear low density polyethylene and the copolymer or non-polar polyethylene can be blended in amounts of about 30 to about 95 parts by weight linear low density polyethylene and about 5 to about 70 parts by weight copolymer or non polar polyolefin for a total of 100 parts by weight. Preferably the blend contains about 40 to about 70 parts by weight linear low density polyethylene and about 30 to about 60 parts by weight copolymer or non polar polyethylene.

Grafting of the unsaturated organic compounds mentioned above, i.e., the acids, acid derivatives, or epoxy esters, is accomplished by mixing same with the polymer blend and an organic peroxide, and heating in an extruder, kneader, or other conventional mixing/heating device, to provide a homogeneous mixture. The grafting temperature is usually in the range of about 130 to about 300° C. and is preferably in the range of about 180 to about 220° C. The organic peroxide (free radical initiator) can be dicumyl peroxide, lauroyl peroxide, benzoyl peroxide, tertiary butyl perbenzoate, di(tertiary butyl)peroxide, cumene hydroperoxide, 2,5-dimethyl-2,5-di(t-butyl-peroxy) hexyne, 2,5-dimethyl-2,5-di(t butyl-peroxy)hexane, tertiary butyl hydroperoxide, or a peroxy ketal. The amount or organic peroxide used in the grafting process can be in the range of about 0.01 to about 10 percent by weight based on the weight of the unsaturated organic compound to be grafted to the polymers in the blend It is understood that grafting will occur without the initiator if a suitable reaction temperature is chosen; however, it is preferable to use the initiator. A trace amount of an initiator is often sufficient to accelerate the grafting process.

Examples of acids, acid anhydrides, and epoxy esters useful in grafting are fumaric acid, acrylic acid, itaconic acid, maleic acid, maleic anhydride and glycidyl methacrylate. Examples of the acyl halides, amides, and imides are acetyl chloride, N-methylolacrylamide, and succinimide.

The amount of grafting compound, which can be used, is in the range of about 0.05 to about 5 percent by weight, based on the weight of the polymer blend, and is preferably in the range of about 0.1 to about 2 percent by weight.

Electrically conductive material is introduced into the adhesive composition either via a masterbatch or by direct mixing. As above, the mixer can be an extruder, a kneader, a rolling machine, or a similar device. A closed mixing device is preferable to prevent scattering of the electrically conductive material. Homogeneous mixing is important in order to avoid variations in electrical conductivity and poor moldability. Conventional additives, such as antioxidants, dispersants, and flame retardants can be added to the composition together with the electrically conductive material. Since many of the electrically conductive materials readily adsorb moisture, they should be protected from moisture or dried before use. Useful electrically conductive materials can be either particulate or fibrous. Examples are carbon black, e.g., acetylene black, furnace black, and Ketjen black; carbon fiber; graphite; and metal powder. Mixtures of electrically conductive materials can also be used. The electrically conductive material is introduced into the adhesive composition in an amount in the range of about 5 to about 50 percent by weight based on the total weight of the polymer blend, and is preferably added in an amount of about 10 to about 30 percent by weight.

It is found that the adhesive composition of this invention adheres to metals such as aluminum, iron, copper, zinc, and tin; plastics such as polyvinyl chloride, nylon, polystyrene, and polyethylene terephthalate; and inorganic material such as glass.

The advantages of the adhesive composition are that it has good low temperature and high temperature adhesiveness, moldability, heat resistance, mechanical characteristics, abrasion resistance, fatigue resistance, warm water resistance, stability, and adhesive durability.

Patents mentioned in this specification are incorporated by reference herein.

The invention is illustrated by the following examples.

EXAMPLES 1 TO 16

100 parts by weight of two resins, Resin A and Resin B, combined; a monomer to be grafted to Resin A; and a free radical initiator to assist grafting are thoroughly mixed in a Henschel mixer and the mixture is fed into an extruder.

The extruder is a double-screw extruder having a screw diameter of 55 millimeters and a length to diameter ratio of 28. The screws rotate at 50 rpm and the barrel temperature is 220° C.

An adhesive composition is formed.

100 parts by weight of the adhesive composition are mixed with an electrically conductive material, an antioxidant, and a dispersing agent in a Banbury mixer at a temperature of 170° C. to 190° C. for 5 to 8 minutes. The resulting mixture is rolled into a sheet, and the sheet is cut into 3 to 4 millimeter square pellets.

Preparation of laminate specimens:

A sheet of aluminum of 0.2 millimeter thickness is prepared and sheets of other metals of 0.05 to 0.10 millimeter thickness are also prepared. The other metals are iron and stainless steel. The sheets are rinsed with xylene.

Adhesive compositions, prepared as above, are compression molded into 0.5 millimeter thick sheets. Each of these sheets is pressed together with a metal sheet, prepared as above, for one minute under a pressure of 30 kilograms per square centimeter and at a temperature of 180° C.

Referring to the drawing, the laminate is made up of two metal layers 1 with adhesive layer 2 in between. The laminate is 150 millimeters in width and 300 millimeters in length. Break lines 3 are inserted lengthwise, 25±0.2 millimeters apart. A test specimen is broken off and one end is separated for a distance of 10 millimeters as in FIG. 2. This procedure is repeated to provide other test specimens. The nylon, saran, and glass laminates are made up in the same way as the metal laminates. The test specimen is inserted in the testing apparatus as in FIG. 3. Each end of the test specimen is attached to grips 4 and 5, respectively. These specimens are used in examples reported in Tables II, III, IV, and V.

Adhesive compositions, prepared as above, are blow molded into a 0.1 millimeter thick film. The film is laminated to sheets of iron, stainless steel, aluminum, nylon, saran, and glass by pressing the film and the sheet together and test specimens are prepared, all as above. These test specimens are used in examples reported in Table II.

Peel strength is measured with an apparatus for measuring tensile strength at a speed of 100 millimeters per minute and at a temperature of 180° C.

The formulations of the adhesive compositions used in the examples are set forth in Table I.

Notes to Table I:

The amounts of Resin A and Resin B are given in parts by weight; the amount of grafted monomer is given in percent by weight based on the total weight of Resin A and Resin B; and the amount of electrically conductive material is given in percent by weight based on the total weight of Resin A and Resin B.

LLDPE is linear low density polyethylene having a melt index of 4 and a density of 0.934 gram per cubic centimeter.

HDPE is high density polyethylene having a melt index of 6 and a density of 0.968 gram per cubic centimeter.

LDPE is low density polyethylene having a melt index of 4.7 and a density of 0.918 gram per cubic centimeter.

EEA is ethylene/ethyl acrylate copolymer having a melt index of 6 and an ethyl acrylate content of 18.5 percent by weight based on the weight of the copolymer.

EVA is ethylene/vinyl acetate copolymer having a melt index of 4 and a vinyl acetate content of 25 percent by weight based on the weight of the copolymer.

VLDPE is very low density polyethylene having a melt index of 1 and a density of 0.905 gram per cubic centimeter. It has a crystallinity of 35 percent by weight.

The initial peel strength, warm water durability, and heat resistance are measured using five specimens for each test. The results for the five specimens are then averaged. The pulling speed of grips 4 and 5 is 200±200 millimeters per second. Measurement is continued for a distance of 10 millimeters.

Table II measures the initial peeling strength with respect to adherends in kilograms per 10 millimeters.

Table III measures the warm water durability of the adhesive composition, i.e., percent retention with respect to initial peel strength after immersion in 60° C. water for a period of time measured in hours. The adherend is aluminum.

Table IV measures the heat resistance of the adhesive composition, i.e., the percent decrease from the heat resistance at 23° C. The adherend is aluminum.

Table V measures the low temperature adhesiveness of the composition in terms of peel strength at 180° C., which is given a value of 100. The adherend is aluminum.

Except for example 13, the examples show good moldability. The reason for the poor showing in example 13 is that example 13 uses high crystallinity, high density polyethylene.

TABLE I

| EXAMPLE | RESIN A | | | RESIN B | | |
|---|---|---|---|---|---|---|
| | HPPE | LDPE | LLDPE | EVA | EEA | VLDPE |
| 1 | — | — | 40 | — | 60 | — |
| 2 | — | — | 50 | — | 50 | — |
| 3 | — | — | 70 | — | 30 | — |
| 4 | — | — | 100 | — | — | — |
| 5 | — | — | 50 | — | 50 | — |
| 6 | — | — | 50 | — | 50 | — |
| 7 | — | — | 50 | 50 | — | — |
| 8 | — | — | 90 | — | — | 10 |
| 9 | — | — | 50 | — | 50 | — |
| 10 | — | — | 50 | — | 50 | — |
| 11 | — | — | 50 | — | 50 | — |
| 12 | — | — | 50 | — | 50 | — |
| 13 | 100 | — | — | — | — | — |
| 14 | — | 100 | — | — | — | — |
| 15 | — | 70 | — | — | 30 | — |
| 16 | — | — | — | — | 100 | — |

| | GRAFTED MONOMER | | | ELECTRICALLY CONDUCTIVE MATERIAL | | |
|---|---|---|---|---|---|---|
| EXAMPLE | MALEIC ANHYDRIDE | ACRYLIC ACID | GLYCIDYL METHACRYLATE | KETJEN BLACK | ACETYLENE BLACK | CARBON FIBERS |
| 1 | 0.5 | — | — | 14 | — | — |
| 2 | 0.5 | — | — | 14 | — | — |
| 3 | 0.5 | — | — | 14 | — | — |
| 4 | 0.5 | — | — | 14 | — | — |
| 5 | 0.5 | — | — | — | 14 | — |
| 6 | 0.5 | — | — | — | — | 40 |
| 7 | 0.5 | — | — | 14 | — | — |
| 8 | 0.5 | — | — | 14 | — | — |
| 9 | — | 1.0 | — | 14 | — | — |
| 10 | — | — | 1.0 | 14 | — | — |
| 11 | 0.5 | — | — | 26 | — | — |
| 12 | 2.0 | — | — | 14 | — | — |
| 13 | 0.5 | — | — | 14 | — | — |
| 14 | 0.5 | — | — | 14 | — | — |
| 15 | 0.5 | — | — | 14 | — | — |
| 16 | — | 1.0 | — | 14 | — | — |

TABLE II

| Example | iron | stainless steel | aluminum | nylon | saran | glass |
|---|---|---|---|---|---|---|
| 1 | 6.5 | 6.1 | 4.0 | 2.7 | 3.5 | 3.1 |
| 2 | 6.0 | 5.9 | 3.5 | 2.4 | 3.0 | 2.2 |
| 3 | 5.8 | 5.8 | 3.5 | 1.9 | 2.7 | 1.5 |
| 4 | 5.2 | 5.1 | 3.1 | 1.2 | 2.1 | 0.7 |
| 5 | 5.7 | 5.7 | 3.2 | 2.0 | 2.2 | 1.5 |
| 6 | 5.4 | 5.5 | 2.8 | * | * | * |
| 7 | 5.5 | 5.4 | 3.2 | 1.8 | 2.5 | 1.3 |
| 8 | 4.5 | 4.3 | 2.0 | 1.9 | 2.3 | 0.8 |
| 9 | 5.7 | 5.9 | 3.4 | 2.5 | 2.7 | 2.1 |
| 10 | 5.5 | 5.6 | 2.9 | 2.2 | 2.4 | 1.7 |
| 11 | 5.7 | 5.6 | 3.1 | 2.0 | 2.3 | 1.5 |
| 12 | 6.2 | 6.0 | 3.8 | 2.6 | 2.5 | 2.2 |
| 13 | 5.1 | 4.7 | 2.9 | 0.7 | 1.1 | 0.6 |
| 14 | 1.9 | 1.8 | 1.1 | 0.3 | 0.4 | 0.1 |
| 15 | 2.6 | 2.6 | 1.8 | 0.8 | 0.9 | 0.9 |
| 16 | ** | ** | ** | ** | ** | ** |

*difficult to form the adhesive compositions into film
**the adhesive compositions break

TABLE III

| | Hours | | | | | |
|---|---|---|---|---|---|---|
| Examples | 0 | 24 | 48 | 96 | 192 | 1000 |
| 1 | 100 | 85 | 81 | 78 | 74 | 71 |
| 2 | 100 | 87 | 84 | 83 | 77 | 76 |
| 3 | 100 | 88 | 84 | 81 | 80 | 78 |
| 4 | 100 | 88 | 88 | 85 | 81 | 78 |
| 5 | 100 | 82 | 76 | 64 | 59 | 57 |
| 6 | 100 | 84 | 81 | 75 | 70 | 67 |
| 7 | 100 | 87 | 85 | 82 | 75 | 76 |
| 8 | 100 | 86 | 84 | 84 | 76 | 77 |
| 9 | 100 | 80 | 83 | 81 | 75 | 75 |
| 10 | 100 | 85 | 80 | 81 | 74 | 72 |
| 11 | 100 | 81 | 77 | 75 | 70 | 70 |
| 12 | 100 | 83 | 80 | 79 | 76 | 74 |
| 13 | 100 | 90 | 88 | 85 | 85 | 83 |
| 14 | 100 | 81 | 76 | 72 | 65 | 58 |
| 15 | 100 | 82 | 80 | 75 | 71 | 69 |
| 16 | 100 | 78 | 75 | 77 | 72 | 70 |

TABLE IV

| Example | 23 °C | 40 °C | 60 °C | 80 °C | 100 °C |
|---|---|---|---|---|---|
| 1 | 100 | 90 | 71 | 30 | 5 |
| 2 | 100 | 100 | 73 | 42 | 18 |
| 3 | 100 | 100 | 100 | 83 | 64 |
| 4 | 100 | 100 | 100 | 97 | 90 |
| 5 | 100 | 100 | 71 | 45 | 10 |
| 6 | 100 | 100 | 76 | 49 | 25 |
| 7 | 100 | 100 | 91 | 74 | 24 |
| 8 | 100 | 100 | 100 | 88 | 54 |
| 9 | 100 | 100 | 70 | 43 | 13 |
| 10 | 100 | 100 | 74 | 52 | 20 |
| 11 | 100 | 100 | 69 | 39 | 15 |
| 12 | 100 | 100 | 73 | 41 | 14 |
| 13 | 100 | 100 | 100 | 100 | 95 |
| 14 | 100 | 93 | 60 | 20 | 0 |
| 15 | 100 | 85 | 61 | 0 | 0 |
| 16 | 100 | 80 | 20 | 0 | 0 |

TABLE V

| Examples | 180 °C | 160 °C | 140 °C | 120 °C | 100 °C | 80 °C |
|---|---|---|---|---|---|---|
| 1 | 100 | 100 | 95 | 90 | 50 | 0 |
| 2 | 100 | 100 | 90 | 90 | 50 | 0 |
| 3 | 100 | 100 | 80 | 70 | 40 | 0 |
| 4 | 100 | 95 | 80 | 60 | 20 | 0 |
| 5 | 100 | 100 | 85 | 70 | 35 | 0 |
| 6 | 100 | 100 | 80 | 60 | 10 | 0 |
| 7 | 100 | 100 | 90 | 90 | 60 | 0 |
| 8 | 100 | 100 | 80 | 80 | 40 | 0 |
| 9 | 100 | 100 | 95 | 90 | 50 | 0 |
| 10 | 100 | 100 | 95 | 90 | 45 | 0 |
| 11 | 100 | 100 | 90 | 75 | 40 | 0 |
| 12 | 100 | 100 | 90 | 85 | 55 | 0 |
| 13 | 100 | 98 | 80 | 20 | 0 | 0 |
| 14 | 100 | 100 | 95 | 95 | 40 | 0 |
| 15 | 100 | 100 | 100 | 95 | 45 | 0 |
| 16 | 100 | 100 | 100 | 100 | 70 | 20 |

We claim:

1. An adhesive composition comprising:
   (a) about 3 to about 95 parts by weight of a grafted linear low density polyethylene;
   (b) about 5 to about 70 parts by weight of a grafted (i) copolymer of ethylene and an unsaturated ester or (ii) a non polar polyethylene having a crystallinity of no greater than about 38 percent by weight based on the weight of the non-polar polyethylene and a density of no greater than about 0.915 gram per cubic centimeter,
   wherein components (a) and (b) have been grafted with an unsaturated organic compound selected from the group consisting of acids, acid anhydrides, acyl halides, amides, imides, and epoxy esters, and parts by weight are based on 100 parts by weight of components (a) and (b) combined; and
   (c) about 5 to about 50 percent by weight of an electrically conductive material in the form of particles or fibers, the percent by weight being based on the total weight of components (a) and (b).

2. The adhesive composition defined in claim 1 wherein the linear low density polyethylene has a density in the range of about 0.915 to about 0.940 gram per cubic centimeter.

3. The adhesive composition defined in claim 1 wherein component (b) is a copolymer of ethylene and an unsaturated ester.

4. The adhesive composition defined in claim 2 wherein component (b) is a non-polar polyethylene having a crystallinity of no greater than about 38 percent by weight based on the weight of the non-polar polyethylene and a density no greater than about 0.915 gram per cubic centimeter.

5. The adhesive composition defined in claim 1 wherein the unsaturated organic compound is an acid.

6. The adhesive composition defined in claim 1 wherein the unsaturated organic compound is an acid anhydride.

7. The adhesive composition defined in claim 1 wherein the unsaturated organic compound is an epoxy ester.

8. The adhesive composition defined in claim 1 wherein the electrically conductive material is carbon black.

9. The adhesive composition defined in claim 1 wherein the electrically conductive material comprises carbon fibers.

10. The adhesive composition of claim 5 wherein the acid is acrylic acid.

11. The adhesive composition of claim 6 wherein the acid anhydride is maleic anhydride.

12. The adhesive composition of claim 7 wherein the epoxy ester is glycidyl methacrylate.

13. The adhesive composition of claim 3 wherein the unsaturated ester is vinyl acetate.

14. The adhesive composition of claim 3 wherein the unsaturated ester is ethyl acrylate 15. The adhesive composition of claim 1 wherein the unsaturated organic compound is present in an amount of abut 0.05 to about 5 percent by weight based on the total weight of components (a) and (b).

16. The adhesive composition of claim 3 wherein the unsaturated ester is present in an amount of less than about 40 percent by weight based on the weight of the copolymer.

* * * * *